United States Patent
Jang et al.

(10) Patent No.: US 7,037,796 B1
(45) Date of Patent: May 2, 2006

(54) METHOD OF MANUFACTURING SPACERS ON SIDEWALLS OF TITANIUM POLYCIDE GATE

(75) Inventors: Se Aug Jang; Tae Kyun Kim, both of Kyoungki-do (KR)

(73) Assignee: Hyundai Electronic Industries Co., Ltd. (KR)

( * ) Notice: Subject to any disclaimer, the term of this patent is extended or adjusted under 35 U.S.C. 154(b) by 1219 days.

(21) Appl. No.: 09/598,673

(22) Filed: Jun. 20, 2000

(30) Foreign Application Priority Data

Jun. 28, 1999 (KR) .............................. 99-24622

(51) Int. Cl.
*H01L 21/336* (2006.01)

(52) U.S. Cl. ................ 438/303; 438/305; 438/682; 438/683; 438/684; 438/685

(58) Field of Classification Search ......... 438/682–683, 438/684–685, 303, 305
See application file for complete search history.

(56) References Cited

U.S. PATENT DOCUMENTS

| 4,843,023 A | 6/1989 | Chiu et al. |
| 5,089,432 A | 2/1992 | Yoo |
| 5,688,706 A * | 11/1997 | Tseng |
| 6,001,738 A | 12/1999 | Lin et al. |
| 6,051,866 A * | 4/2000 | Shaw et al. .................. 257/417 |

FOREIGN PATENT DOCUMENTS

| JP | 2181934 | 7/1990 |
| JP | 7249761 | 9/1995 |

* cited by examiner

*Primary Examiner*—Long Pham
(74) *Attorney, Agent, or Firm*—Pillsbury Winthrop LLP

(57) ABSTRACT

Disclosed is a method for manufacturing a semiconductor device, more particularly to a method of forming a spacer on side-walls of a titanium polycide gate. The method for manufacturing the semiconductor device is as follows. There is provided a semiconductor substrate in which a gate oxide layer, a polysilicon layer, a titanium silicide layer and a patterned hard mask layer are sequentially formed. Herein, the titanium polycide gate is fabricated by an etching step employing the patterned hard mask. Afterward, the substrate is thermal-treated at temperature of 700~750° C. according to a gate re-oxidation process, thereby forming a re-oxidation layer on side-walls of the gate and on the substrate surface. Next, an oxide layer for spacer is deposited on the resultant at process temperature of 350~750 C., and a nitride layer is deposited on the oxide layer. Thereafter, a spacer is formed on side-walls of the gate and the hard mask layer by blanket-etching the nitride layer, the oxide layer and the re-oxidation layer.

4 Claims, 4 Drawing Sheets

METHOD OF MANUFACTURING SPACERS ON SIDEWALLS OF TITANIUM POLYCIDE GATE

BACKGROUND OF THE INVENTION

1. Field of the Invention

The present invention relates to a method of manufacturing semiconductor device, more particularly to a method of forming a spacer on side-walls of a titanium polycide gate.

2. Description of the Related Art

Mostly polysilicon or polysilicon/tungsten silicide has been used for gate material of an MOSFET. As the line width of a gate is decreased due to the enhanced integrity of semiconductor devices, it is difficult to satisfy low resistance in the gate having fine line width with the foregoing polysilicon or polysilicon/tungsten silicide material.

Therefore, to satisfy low resistance in the fine line width, a Ti-polycide gate consisting of a stack structure of polysilicon and titanium silicide $TiSi_2$ has been highlighted as for the gate material. The titanium silicide has relatively excellent properties required as a gate material such as low resistivity, high melting point, easiness in manufacturing of thin film as well as pattern, and thermal stability.

Meanwhile, the increase of resistance in the gate having decreased line width can be prevented by varying the material of the gate. As noted in the art, the short channel effect caused by the decrease of channel length can be prevented by using the LDD(Lightly doped drain) structure.

Hereinafter, a method of manufacturing a semiconductor device having the conventional titanium polycide gate will e described with reference to FIGS. 1A to 1C.

Referring to FIG. 1A, a semiconductor substrate 1 is provided, a gate oxide layer 2, a polysilicon layer 3, a titanium silicide layer $TiSi_2$ 4 and a patterned hard mask 5 are successively deposited on the semiconductor substrate 1. The titanium silicide layer 4, the polysilicon layer 3 and the gate oxide layer are etched by using the hard mask 5 as a etching mask, thereby forming a Ti-polycide gate 10.

To recover the damage caused during the etching step, to remove polysilicon residues, and to improve reliability of the gate oxide layer 2, a gate re-oxidation process is performed. As a result, a re-oxidation layer 11 is formed on side-walls of the Ti-polycide gate 10 and on a surface of the substrate 1. At this time, the gate re-oxidation process is performed at temperature of below 750° C. so that abnormal oxidation at an exposed portion of the titanium silicide layer 4 is prevented.

To form the LLD structure, a selected impurity(not shown) is implanted with low concentration into a portion of the substrate 1 of both sides of the gate 10.

Referring to FIG. 1B, an oxide layer 12 is deposited on the resultant by the low pressure chemical vapor deposition process("LPCVD") using $SiH_4$ gas and $N_2O$ gas, and a nitride layer 13 is deposited on the oxide layer 12.

Referring to FIG. 1C, the nitride layer 13, the oxide layer 12 and the re-oxidation layer 11 are blanket-etched, thereby forming a spacer 20 on side-walls of the gate 10 and the hard mask 5.

Although not shown in the drawing, a selected impurity is implanted with high concentration into the exposed substrate region 1 by using the spacer 20 and the gate 10 as a mask, thereby completing the semiconductor device having the T-polycide gate and the LDD structure.

However, according to the foregoing conventional method of fabricating the semiconductor device, the abnormal oxidation of the titanium silicide layer 4 during deposition of the oxide layer 12 is occurred. As a result, an abnormal oxidation 15 is formed on side-walls of the titanium silicide layer 15, thereby degrading the property of the gate 10. The above result is caused by depositing the oxidation layer 12 at temperature of 780° C. that is higher than 750° C., and by using the $N_2O$ gas as a reaction gas, which has excellent oxidizing power compared to $O_2$.

Moreover, profile of the gate 10 is heterogeneous and the heterogeneity of the profile of the gate 10 has a bad influence upon profile of the spacer 20. Therefore, it is difficult to obtain the reliability of device.

SUMMARY OF THE INVENTION

Accordingly, the object of the present invention is to provide a method of manufacturing a semiconductor device capable of preventing abnormal oxidation at side faces of a titanium polycide gate during the deposition of an oxide layer for a spacer.

A method for manufacturing the semiconductor device of the present invention to accomplish the foregoing object is as follows. First of all, there is provided a semiconductor substrate in which a gate oxide layer, a polysilicon layer, a titanium silicide layer and a patterned hard mask layer are sequentially formed. Herein, the titanium polycide gate is fabricated by an etching step employing the patterned hard mask. Afterward, the substrate is thermal-treated at temperature of 700~750° C. according to a gate re-oxidation process, thereby forming a re-oxidation layer on side-walls of the gate and on the substrate surface. Next, an oxide layer for spacer is deposited on the foregoing substrate at process temperature of 350~750° C., and a nitride layer is deposited on the oxide layer. Thereafter, a spacer is formed on side-walls of the gate and the hard mask layer by blanket-etching the nitride layer, the oxide layer and the re-oxidation layer.

Herein, the oxide layer for spacer is preferably deposited by the LPCVD process employing $SiH_4$ and $N_2O$ gas at temperature of 730~750° C.

Further, the oxide layer for spacer is preferably deposited by the LPCVD process employing a pyrolysis method of TEOS($Si(OC_2H_5)$) at temperature of 600~710° C.

Moreover, the oxide layer for spacer is deposited according to the LPCVD process using $SiH_4$ gas and $O_2$ gas as a source gas with deposition rate of 80~120 Å/min at temperature of 400~450° C.

The oxide layer for spacer is also deposited preferably by a plasma enhanced chemical vapor deposition(PECVD) method employing TEOS($Si(OC_2H_5)$), $O_2$ gas and an inert gas at temperature of 350~400° C.

BRIEF DESCRIPTION OF THE DRAWINGS

The object, aspect and advantages of the present invention will be readily understood with reference to those detailed descriptions and attached drawings.

DETAILED DESCRIPTION OF THE INVENTION

Hereinafter, the preferred embodiment of the present invention will be discussed with reference to the attached drawings.

Figure 1A:
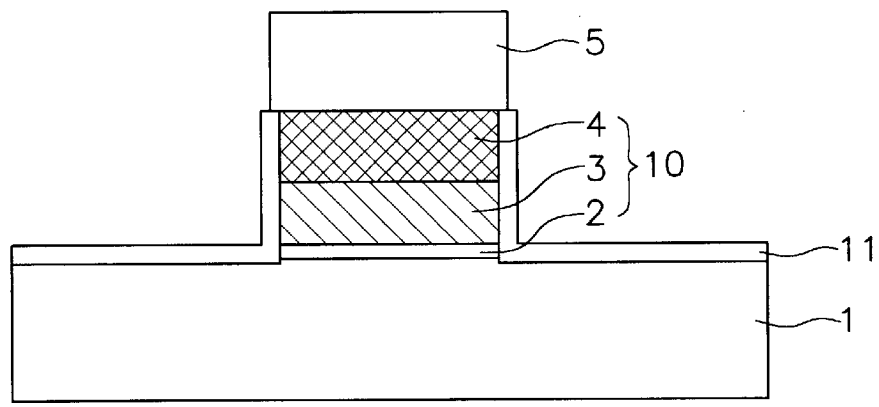
FIGS. 1A to 1C are cross-sectional views for illustrating a conventional method of manufacturing a semiconductor device.
Figure 1B:
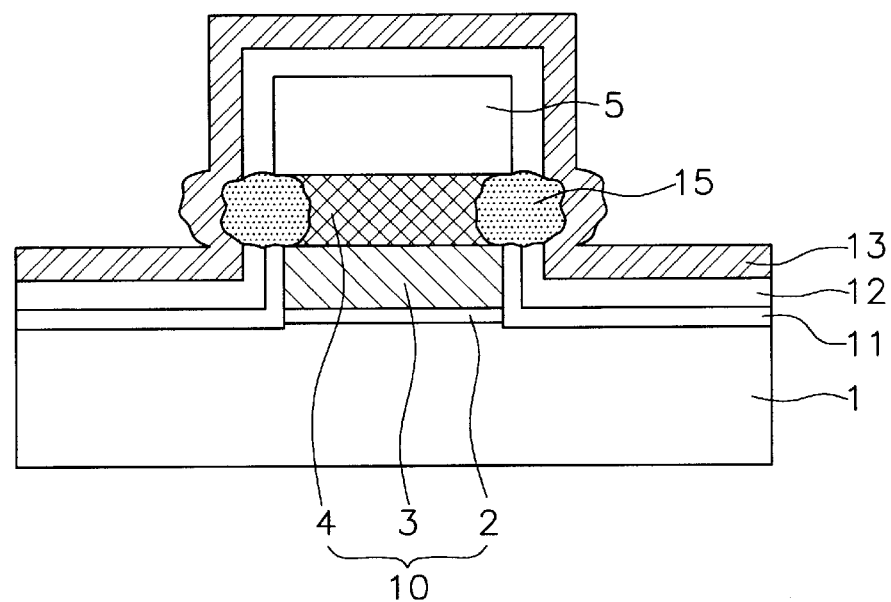
Figure 1C:
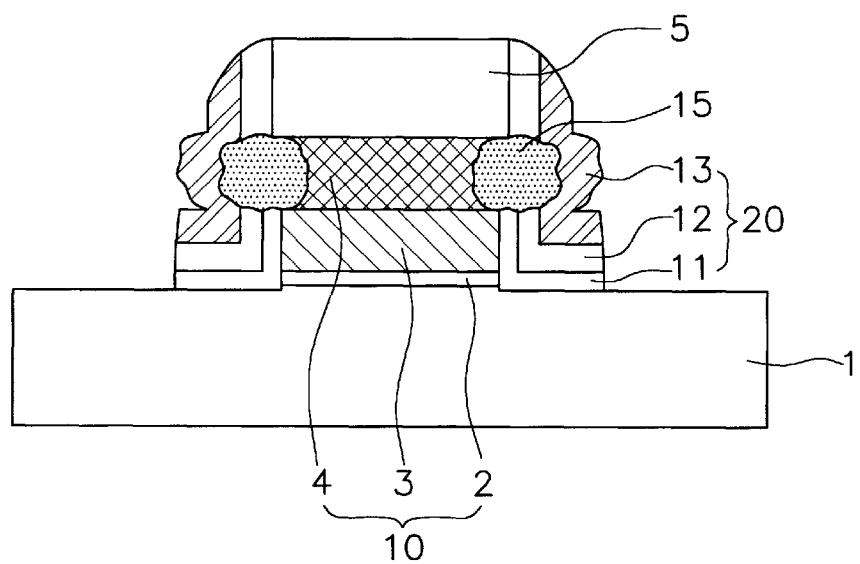
Figure 2A:
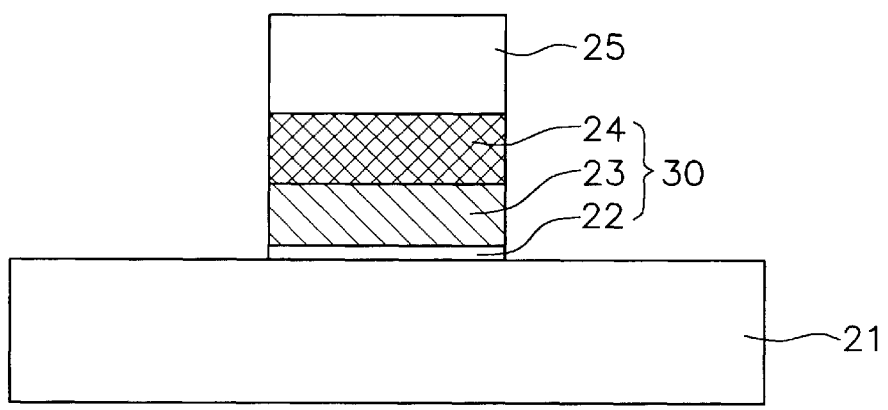
FIGS. 2A and 2E are cross-sectional views for illustrating a method of manufacturing a semiconductor device according to the present invention.

Referring to FIG. 2A, a semiconductor substrate 21 is provided, and there are successively deposited a gate oxide layer 22, a polysilicon layer 23, and a titanium silicide layer 24 of TiSi$_2$. A patterned hard mask 25 is formed on said titanium silicide layer 24, and the titanium silicide layer 24, the polysilicon layer 23 and the gate oxide layer 22 are etched by using the patterned hard mask 25 as a etching mask thereby forming a titanium-polycide gate 30.

Figure 2B:
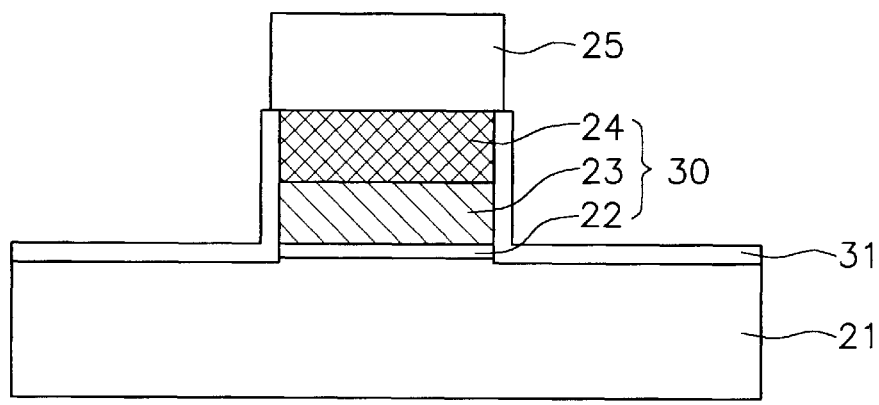

Referring to FIG. 2B, to remove damages occurred during the etching step for forming the gate 30 and polysilicon residues and to improve the reliability of the gate oxide layer 22, a gate re-oxidation process is performed. As a result, a re-oxidation layer 31 with a uniform thickness is formed on side-walls of the gate 30 and on a surface of the substrate 21. The gate re-oxidation process is performed preferably at temperature of 700~750° C. so that an abnormal oxidation of exposed portions of the titanium silicide layer 24 is prevented. A selected impurity(not shown) is implanted with low concentration into the portion of substrate 21 at both sides of the gate 30.

Figure 2C:
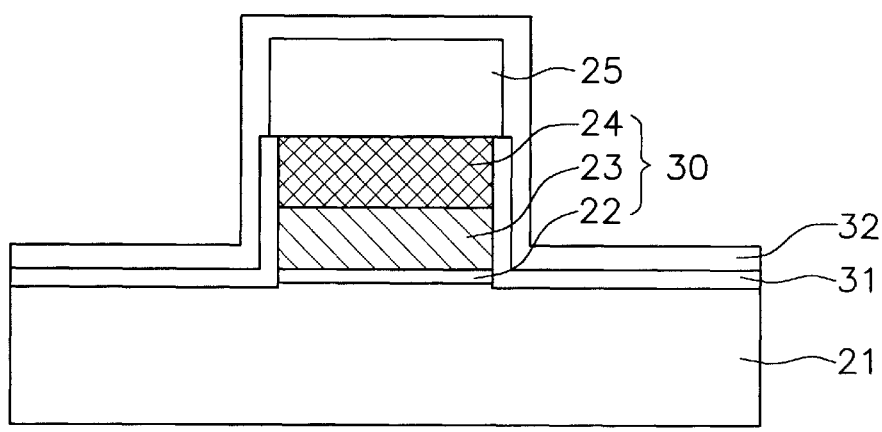

Referring to FIG. 2C, an oxide layer 32 is deposited on the foregoing substrate 21 with thickness of 50~100 Å. More particularly, the oxide layer 32 is deposited by the LPCVD process employing SiH$_4$ gas and N$_2$O gas at temperature of 730~750° C. Further, the oxide layer 32 is deposited by the LPCVD process using the pyrolysis method of TEOS(Si (OC$_2$H$_5$)) at temperature of 600~710° C. The oxide layer 32 is deposited according to the LPCVD process using preferably SiH$_4$ gas and O$_2$ gas as a source gas with deposition rate of 80~120 ÅA/min at temperature of 400~450° C. Additionally, the oxide layer 32 is also deposited preferably by the PECVD method employing TEOS(Si(OC$_2$H$_5$)), O$_2$ gas and an inert gas such as He or N$_2$ at temperature of 350~400° C.

Herein, since the oxide layer 32 is deposited at temperature of relatively lower than the conventional process temperature, the abnormal oxidation at exposed portions of the titanium silicide layer 24 is not occurred during the deposition of the oxide layer 32. Accordingly, a profile of the gate 30 is not heterogeneous, and also heterogeneous spacer due to the heterogeneous profile of the gate 30 is not occurred in the subsequent process.

Figure 2D:
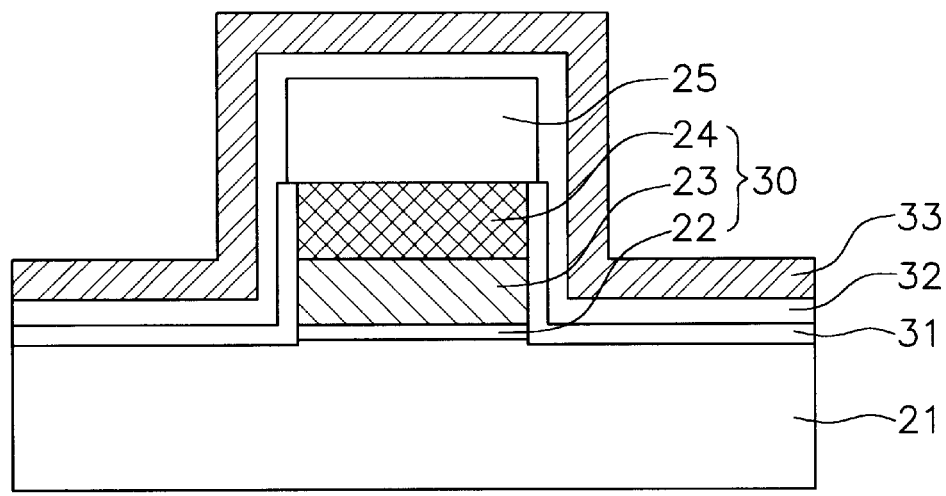
Figure 2E:
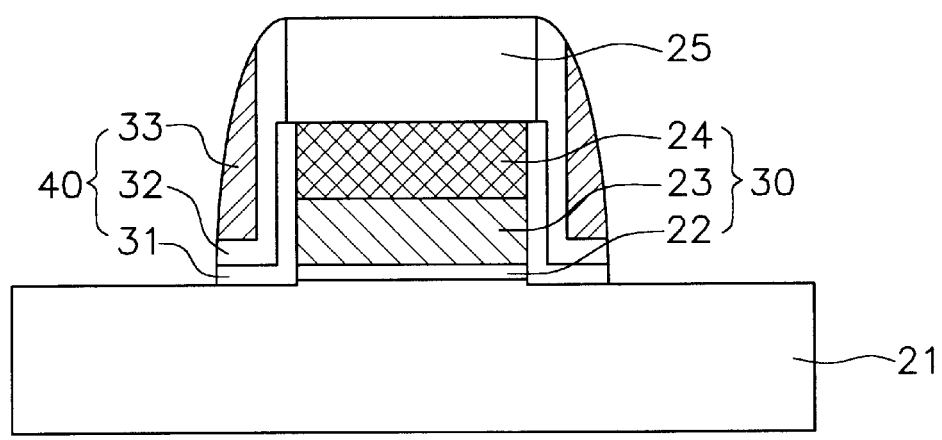

Referring to FIG. 2D, a nitride layer 33 is deposited on the oxide layer 32 with thickness of 100~400 Å. Referring to FIG. 2E, a spacer 40 is formed on the gate 30 and on a side-wall of the hard mark 25 by blanket-etching the nitride 33, the oxide layer 32 and the re-oxidation layer 31.

Meanwhile, although not shown in the drawings, a selected impurity is implanted with high concentration into the substrate 21, thereby completing a semiconductor device having the titanium polycide gate and the LDD structure.

As described in detail, the abnormal oxidation of the titanium silicide layer of titanium polycide gate during a deposition process of the oxide layer can be prevented by modifying deposition conditions of the oxide layer for spacer. Therefore, the property and reliability of the gate can be obtained as well as the device reliability.

Although the preferred embodiment of the present invention has been described and illustrated, various other modifications will be apparent to and can be readily made by those skilled in the art without departing from the scope and spirit of this invention.

What is claimed is:

1. A method of manufacturing a semiconductor device, comprising the steps of:

providing a semiconductor substrate in which a gate oxide layer, a polysilicon layer, a titanium silicide layer and a patterned hard mask layer are sequentially formed, and wherein the titanium silicide layer, the polysilicon layer and the gate oxide layer are etched using the patterned hard mask as an etching mask to form a titanium polycide gate; re-oxidizing the substrate at temperature of 700~750° C. to form a re-oxidation layer on a side wall of the gate and on a surface of the substrate;

depositing an oxide layer on the resultant structure at process temperature of 350~750° C. to form a re-oxidation layer on a side wall of the gate and on a surface of the substrate;

depositing a nitride layer on the oxide layer; and forming a spacer on the gate and on a side wall of the hard mask by blanket-etching the nitride layer, the oxide layer and the re-oxidation layer wherein the oxide layer is formed by a low pressure chemical vapor deposition process (LPCVD) comprising a pyrolysis method of TEOS (Si(OC$_2$H$_5$)) at a temperature of 600~710° C.

2. A method of manufacturing a semiconductor device, comprising the steps of:

providing a semiconductor substrate in which a gate oxide layer, a polysilicon layer, a titanium silicide layer and a patterned hard mask layer are sequentially formed, and wherein the titanium silicide layer, the polysilicon layer and the gate oxide layer are etched using the patterned hard mask as an etching mask to form a titanium polycide gate;

re-oxidizing the substrate at temperature of 700~750° C. to form a re-oxidation layer on a side wall of the gate an d on a surface of the substrate;

depositing an oxide layer on the resultant structure at process temperature of 350~750° C. to form a re-oxidation layer on a side wall of the gate and on a surface of the substrate;

depositing a nitride layer on th e oxide layer; and forming a spacer on the g ate and on a side wall of the hard mask b y blanket-etching the nitride layer, the oxide layer and the re-oxidation layer, wherein the oxide layer is formed by a plasma enhanced chemical vapor deposition process (PECVD) comprising TEOS (Si (OC$_2$H$_5$)), O$_2$ gas and an inert gas at temperature of 350~400° C.

3. A method of manufacturing a semiconductor device comprising the steps of:

providing a semiconductor substrate in which a gate oxide layer, a polysilicon layer, a titanium silicide layer and a patterned hard mask layer are sequentially formed, and wherein the titanium silicide layer, the polysilicon layer and the gate oxide layer are etched using the patterned hard mask as an etching mask to form a titanium polycide gate;

re-oxidizing the substrate at a temperature of 700~750° C. to form a re-oxidation layer on a side-wall of the gate and on a surface of the substrate;

forming an oxide layer on the resultant structure using a low pressure chemical vapor deposition process (LPCVD) employing a pyrolysis method of TEOS (Si(OC$_2$H$_5$)) at a temperature of 600~710° C.;

depositing a nitride layer on the oxide layer; and forming a spacer on the gate and on a side-wall of the hard mask by blanket-etching the nitride layer, the oxide layer, and the re-oxidation layer.

4. A method of manufacturing a semiconductor device comprising the steps of:

providing a semiconductor substrate in which a gate oxide layer, a polysilicon layer, a titanium silicide layer and a patterned hard mask layer are sequentially formed, and wherein the titanium silicide layer, the polysilicon layer and the gate oxide layer are etched using the patterned hard mask as an etching mask to form a titanium polycide gate;

re-oxidizing the substrate at a temperature of 700~750° C. to form a re-oxidation layer on a side-wall of the gate and on a surface of the substrate;

forming an oxide layer on the resultant structure using a plasma enhanced chemical vapor deposition (PECVD) employing TEOS ($Si(OC_2H_5)$), $O_2$ gas, and an inert gas at a process temperature of 350~400° C.;

depositing a nitride layer on the oxide layer; and forming a spacer on the gate and on a side-wall of the hard mask by blanket-etching the nitride layer, the oxide layer, and the re-oxidation layer.

\* \* \* \* \*